United States Patent
Roldan et al.

[11] Patent Number: 5,854,514
[45] Date of Patent: Dec. 29, 1998

[54] LEAD-FREE INTERCONNECTION FOR ELECTRONIC DEVICES

[75] Inventors: Judith Marie Roldan, Ossining; Ravi F. Saraf, Briarcliff Manor, both of N.Y.

[73] Assignee: International Buisness Machines Corporation, Armonk, N.Y.

[21] Appl. No.: 693,923

[22] Filed: Aug. 5, 1996

[51] Int. Cl.$^6$ ........................................ H01L 23/48
[52] U.S. Cl. ................ 257/746; 257/737; 257/747; 257/783; 438/610
[58] Field of Search ............................ 257/737, 746, 257/747, 783, 777

[56] References Cited

U.S. PATENT DOCUMENTS

| | | |
|---|---|---|
| 4,822,523 | 4/1989 | Prud'Homme . |
| 5,086,558 | 2/1992 | Grube et al. . |
| 5,492,863 | 2/1996 | Higgens, III ............................ 437/183 |
| 5,508,228 | 4/1996 | Nolan et al. . |
| 5,535,101 | 7/1996 | Miles et al. . |
| 5,543,585 | 8/1996 | Booth et al. . |

*Primary Examiner*—Caridad Everhart
*Attorney, Agent, or Firm*—Tung & Associates

[57] ABSTRACT

An electronic device that is equipped with a plurality of bonding pads positioned on the device for making electrical interconnections and electrically conductive composite bumps adhered to the bonding pads wherein the bumps are formed of a composite material consisting of a thermoplastic polymer and at least about 30 volume percent of conductive metal particles based on the total volume of the metal particles and the thermoplastic polymer. The present invention is also directed to a method of making electrical interconnections to an electronic device by pressing a plurality of composite bumps of a polymeric based material against a substrate having an electrically conductive surface by mechanical means under a sufficient temperature and/or a sufficient pressure. The present invention is further directed to a method of debonding an electronic device bonded by a composite binder by first providing an electronic device that is bonded by composite bumps consists of a thermoplastic polymer and at least about 30 volume percent of conductive metal particles and then exposing the composite bumps to a solvent or to a temperature not less than about 50% ° C. below the glass transition temperature of the composite bump.

21 Claims, 4 Drawing Sheets

LEAD-FREE INTERCONNECTION FOR ELECTRONIC DEVICES

FIELD OF THE INVENTION

The present invention generally relates to an electronic device equipped with a plurality of pads and electrically conductive composite bumps adhered to the pads and a method of making such electronic device, and more particularly, relates to an electronic device that is equipped with a plurality of pads and electrically conductive composite bumps adhered to the pads wherein the composite bumps are formed of thermoplastic polymeric binder and at least 30% by volume of conductive metal particles based on the total volume of the metal particles and the thermoplastic polymer and a method of fabricating such electronic device.

BACKGROUND OF THE INVENTION

In semiconductor packaging technology, the process of building contact bumps on I/O pads of an integrated circuit chip is very important. It allows the chip to communicate with a circuit board or a substrate on which it is mounted. Since contact bumps are frequently constructed by complex vacuum processing and elaborate multilayer structure of the I/O pads, the bumps contribute to a large portion of the total packaging cost. For chips, the multilayer pad structure is called ball limiting metallurgy (BLM) and, the bumps are made by the well known controlled collapsed chip connection (C4) process. A fabrication process for building bumps and for the subsequent bonding of the bumps to a chip which can be accurately controlled with high reliability and for high I/O counts not achievable by other manufacturing methods is therefore very desirable.

In a conventional method of building contact bumps, bumps of a lead (Pb)-rich alloy are deposited on aluminum pads positioned on the surface of an integrated circuit (IC) chip. In a more recently developed packaging technology for area array chips, the chips are first bumped with an alloy containing lead and then tested by using a test head equipped with sharp pins. The Pb-containing solder bumps which are relatively soft are damaged during the test which then requires an additional reflow process prior to the chip joining step.

The chip testing (or burn-in) for functional and reliability such as a known-good-die (KGD) test is an important and necessary step in IC chip fabrication and therefore, it is very desirable to provide an IC package that can be tested without suffering damage. This becomes more important when inexpensive chips are mounted on expensive substrates. It is also desirable to build bumps on the I/O pads of IC chips with a reworkable material such that the IC chip can be debonded from a substrate (or another IC chip) if defects are found during testing or operation in the field. In general, a desirable contact bump should also be mechanically compliant, elastic and has low contact resistance. A desirable contact bump should also be stable under various environmental conditions such as heat and humidity that are frequently encountered in service environments.

It is therefore an object of the present invention to provide an electronic device that is equipped with a plurality of pads and electrically conductive bumps adhered to the pads that does not have the drawbacks and shortcomings of conventional electronic devices equipped with pads and bumps.

It is another object of the present invention to provide an electronic device that is equipped with a plurality of pads and electrically conductive bumps adhered to the pads such that the bumps are reworkable after being bonded to a substrate or another electronic device. Multilayer ceramic or organic circuit board are examples of substrates conventionally used.

It is a further object of the present invention to provide an electronic device that is equipped with a plurality of pads and electrically conductive composite bumps adhered to the pads wherein the bumps are formed of a material consisting of thermoplastic polymeric binder and at least about 30% by volume of a conductive metal particles based on the total volume of the metal particles and the thermoplastic polymer.

It is still another object of the present invention to provide an electronic device that is equipped with a plurality of pads and electrically conductive composite bumps adhered to the pads wherein the composite bumps are compliant and elastic to allow the bumps to establish electrical interconnection with another electronic device by the application of a compressive force on the devices.

It is yet another object of the present invention to provide an electronic device that is equipped with a plurality of pads and electrically conductive composite bumps adhered to the pads wherein the composite bumps are compliant and pliable when compared to conventional solder bumps such that highly reliable interconnections to another electronic device can be made.

It is another further object of the present invention to provide an electronic device that is equipped with a plurality of pads and electrically conductive composite bumps adhered to the pads such that the electronic device can be interconnected to another electronic device that is similarly equipped with pads and composite bumps by mechanical means.

It is still another further object of the present invention to provide an electronic device that is equipped with a plurality of pads and electrically conductive composite bumps adhered to the pads such that the electronic device can be interconnected electrically to another electronic device that is similarly equipped with pads and composite bumps under a predetermined pressure and heat.

It is yet another further object of the present invention to provide an electronic device that is equipped with a plurality of pads and electrically conductive composite bumps adhered to the pads such that after the device is bonded to another electronic device similarly equipped with composite bumps, the two electronic devices can be separated by reworking the composite bumps under heat and solvent.

It is yet another further object of the present invention to provide a method of fabricating an electronic device that is equipped with a plurality of pads and electrically conductive composite bumps adhered to the pads wherein the composite bumps are formed by a thermoplastic polymeric binder and at least about 30% by volume of conductive metal particles based on the total volume of the metal particles and the thermoplastic polymer.

SUMMARY OF THE INVENTION

The present invention provides an electronic device that is equipped with a plurality of pads positioned on the device for making electrical interconnection thereto and electrically conductive composite bumps adhered to the pads wherein the composite bumps are made of a thermoplastic polymeric binder and at least about 30% by volume of conductive metal particles based on the total volume of the metal particles and the thermoplastic polymer. The present invention also provides a method of fabricating such electronic device.

In a preferred embodiment, an electronic device having a plurality of bonding pads positioned on the device and bumps made of electrically conductive first composite material adhered to the pads is provided. The bumps are in electrical contact with the pad. The electrically conductive first composite material consists of a thermoplastic polymeric binder and at least about 30% by volume of conductive metal particles based on the total volume of the metal particles and the thermoplastic polymer. The electronic device further includes a substrate with plurality of pads with electrically connecting surface that are positioned over the corresponding pads with the bumps and pressing the substrate and bumps together by mechanical means at sufficient pressure such that electrical interconnections are made between the two pads via the bump. The substrate may be a connector, a printed circuit board, a multi-layer structure, a second electronic device or a semiconductor device.

In an alternative embodiment, the electronic device further includes a second composite positioned over corresponding ones of the first composite to form an electrical and mechanical joint. The device further includes electrical contacts adhered to the respective ones of the second composite which are positioned on a substrate in a predetermined relationship to one another. The substrate may be a connector, a printed circuit board, a multi-layer structure, a second electronic device or a semiconductor device. The second composite is also a thermoplastic based polymer containing at least about 30% by volume of conductive metal particles. Generally, the first composite has a glass transition temperature that is lower than or equal to the glass transition temperature of the second composite. In the alternate embodiment, the electronic device and the substrate may be bonded together by contacting each other under pressure and heat.

In either of the embodiments, the electronic device and the substrate may be later separated after a known-good-die test where defects are detected by either removing the mechanical pressure placed on the device and the substrate, or by removing the composite bumps by exposing them to heat and solvent. The reworkability of the composite bump is a very desirable feature especially in applications where a non-functional electronic device may be replaced in the field by a functional device.

The present invention also provides a method of making an electrical connection to an electronic device by first providing an electronic device that has a plurality of bonding pads positioned on the device, then depositing a plurality of electrically conductive bumps of a polymeric based composite on the bonding pads, providing a substrate that has an electrically conductive surface on top, and then pressing the plurality of bumps and the substrate together by mechanical means under a sufficient pressure such that electrical connection is established between the bumps and the electrically conductive surface on the substrate.

The present invention further provides a method of removing an electronic device from a substrate which are joined by composite bumps wherein the composite bumps include a thermoplastic polymer and at least about 30% by volume of conductive metal particles based on the total volume of the metal particles and the thermoplastic polymer by immersing the composite bumps in a solvent.

The present invention further provides a method for debonding an electronic device that is bonded by composite bumps to another electronic device including the steps of first providing an electronic device that is bonded by composite bumps where the bumps are formed of a thermoplastic polymeric binder and not less than 30% by volume of metal particles based on the total volume of the metal particles and the thermoplastic polymer, and then exposing the composite bumps to a temperature not less than about 50° C. below the glass transition temperature of the composite bumps for a length of time that is sufficient to cause flow in the composite bumps.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1A:
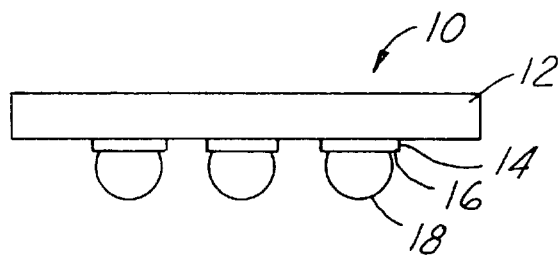
FIGS. 1A–1D shows enlarged, cross-sectional views of the preferred embodiment of the present invention wherein composite bumps are mechanically joined to bonding pads on a substrate.

In accordance with the present invention, an electronic device that is equipped with a plurality of pads positioned on a device for making electrical interconnections thereto and electrically conductive composite bumps adhered to the pads wherein the composite bumps are formed of a thermoplastic polymeric binder and at least about 30% by volume of conductive metal particles based on the total volume of the metal particles and the thermoplastic polymer is provided.

In the preferred embodiment, a first composite is dispensed on the I/O pads of a first electronic device forming electrically resistive composite bumps. The bumps are dried and then annealed to a final temperature of less than 260° C. to convert them to electrically conductive bumps. By being electrically resistive and electrically conductive, it is meant that the bump has a resistivity of either higher than 1000 $\mu\Omega$-cm or lower than 1000 $\mu\Omega$-cm, respectively. It is believed that prior to the annealing of the composite bump, the free volume existed in the polymeric phase of the bump (which behaves as voids) prevents intimate contact between metal particles which is essential for electrical conductivity.

The conductive bumps are mechanically contacted to the corresponding I/O pads of a second electrical device such that an electrical connection between the two devices is established. The contact can be broken by simply removing the mechanically loading used to establish the contact. It was discovered that in normal applications, the force required to establish the contact is less than about 1,000 psi. The preferred embodiment of the present invention therefore presents an advantageous chip testing method in which a first electronic device is a chip and a second electronic device is a chip tester. The conductivity of the electrically conductive composite bumps has been found to be equal to or better than solder and furthermore, they are resilient to thermal cycle and moisture exposure in environmental and functional testing. The burn-in of an IC chip can therefore be advantageously performed by the present invention method.

The preferred embodiment of the present invention method can be illustrated in FIGS. 1A~1D. An electronic device 12 having a plurality of electrical contact I/O pads 14 each having an electrically conductive surface 16. The electrically conductive surface 16 is defined as a surface where at least a portion of the surface is free of an insulating coating. For instance, a gold surface is an electrically conductive surface since it is always oxide free while tin surface is also electrically conductive because its oxide is conducting. Organic materials such as doped polyaniline and polythiopthene may also be electrically conducting.

On the electrically conducting surface 16, a first composite material 18 is dispensed on the pads 14 to form a wet resistive bump 18. By resistive, it is meant that the resistivity of the bump is larger than 1000 $\mu\Omega$-cm. The first composite material 18 is composed of a thermoplastic polymer binder, a solvent and conductive solid particles. The thermoplastic binder can be either a single component made of a homopolymer or a segmented copolymer, or a blend of one homopolymer or copolymer. The segment length of the copolymer can be made from one repeating unit to many repeating units. The repeating units of the polymer can be benzene rings with linkages made of siloxane, and/or moieties containing sulfur (such as sulfones) or nitrogen (such as imides).

The solvent system used to form the wet resistive bumps consists of one or more organic solvents selected from a group of solvent consisting of ethers, esters, amides, lactones, ketones, sulfones and aromatic hydrocarbons. Some typical solvents used include N-methyl-pyrrolidinone (NMP), diglyme, triglyme, xylene, amyl acetate and acetophenone.

The conductive solid particles utilized in the present invention for forming the wet resistive bumps comprise of noble metals such as gold, silver, palladium, or composite particles of inorganic or metallic core coated with a noble metal. The inner core of the composite particles can be metal or semiconducting oxides such as silicon oxide, aluminum oxide, or metals such as copper, nickel and tin. The size of the particles can be less than 10 $\mu$m to achieve fine pitch dispensability that is required for the interconnection. The shape of the particles are primarily flakes with some spheres. The relative amount of spherical particles varies between about 0 and about 75%.

A typical composition of the wet resistive bump is about 10~20% solvent, about 7~13% polymer binder and about 69~78% conductive filler by weight. The paste can be dispensed by screening through a stencil, by screen printing, or by injecting through a syringe to form the wet resistive bumps.

Figure 1B:
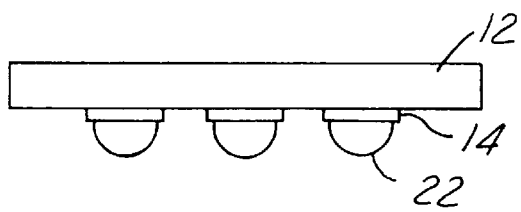
Figure 2B:
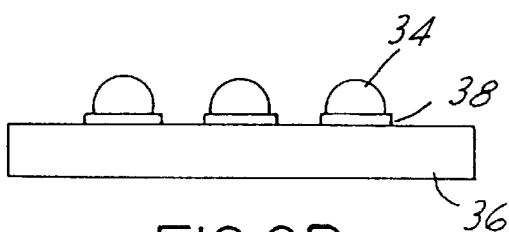

After the wet resistive bumps are formed, they are dried and annealed to form electrically conductive bumps 22 as shown in FIG. 1B. By electrically conductive, it is meant that the bumps have a resistivity of less than 1000 $\mu\Omega$-cm. The drying temperature for the wet resistive bumps is usually less than 150° C., while the annealing temperature for the dry resistive bump is usually less than 260° C. The environment used during drying and annealing can be vacuum, air, an inert gas, or a reducing atmosphere. Typical inert gases used can be nitrogen, argon, helium, etc. Typical reducing atmosphere used can be a forming gas, hydrogen, etc. During the drying operation, an ambient atmosphere or vacuum is preferred. During the annealing operation, a reducing atmosphere or vacuum is preferred.

Figure 1C:
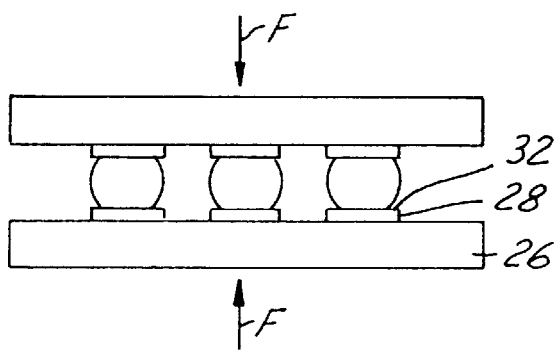

A second electronic device 26 having bonding pads 28 built thereon is then provided. This is shown in FIG. 1C. The bonding pads 28 have an electrically conducting surface 32 as previously defined. The corresponding bonding pads 28 of the second electronic device 26 and the electrically conductive bumps 22 on the first electronic device 12 can be interconnected mechanically by applying a force F as shown in FIG. 1C. The mechanical force F relates to a pressure exerted on the two electronic devices 12 and 26 by dividing F by the total contact area between the electrically conductive bumps 18 and the bonding pads 28. It has been found that a contact pressure of less than about 2,000 psi, preferably less than about 1,000 psi, and more preferably less than about 100 psi would work satisfactorily in the present invention bonding method. The mechanical force F may be generated by mechanical means such as spring, gravity or pneumatic means.

Figure 1D:
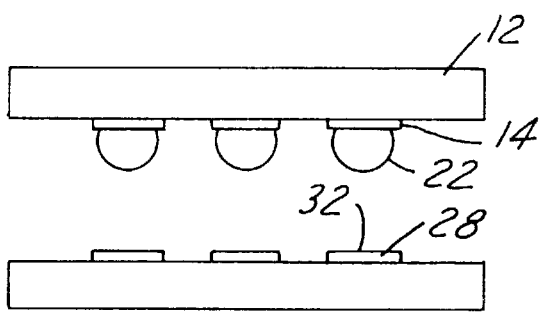

Another advantage made possible by the present invention is that the interconnection can be easily disassembled (or removed) by simply removing the load F and dismantling the assembly to recover the electronic devices 12 and 26 as shown in FIG. 1D.

It should be noted that the use of a mechanically compliant and elastic binder in the composite bump is important for achieving a low contact resistance. The elasticity of the binder normally allows the binder to deform elastically to at least 15%, and preferably to at least 25%. The thermoplastic polymer binder used in the preferred embodiment of the present invention is therefore superior to a hard thermoset polymer binder such as epoxy, which would crack under high mechanical loading by deforming less than 10%. Furthermore, the present invention composite bump provides the additional benefit of having a surface that will not form oxide when compared to a metallic bump such as a lead-rich bump where the contact resistance is poor due to the formation of lead oxide on the surface.

It should also be noted that the reworkability of the composite bump provides a unique and novel advantage of the present invention for carrying out repairs in the field where a nonfunctional chip can be replaced with a functional chip. It is noted that the steps shown in FIG. 1C could be a chip testing process. When the electronic device 12 is a chip, then a chip testing process of either a chip burn-in and stress testing, or a functionality and performance testing can be performed. An IC chip may be advantageously tested electrically in various adverse environments such as at a temperature above 100° C., a humidity over 70%, and a thermal cycling from less than 5° C. to above 80° C. During a functionality and performance testing, the chip can be tested to measure the electrical performance of the chip such as speed. Furthermore, the I/O pads 14 of the chip can be as small as 100 $\mu$m in diameter, preferably 250 $\mu$m in diameter at a center to center distance of 200 $\mu$m, preferably 500 $\mu$m.

One important application for the preferred embodiment of the present invention is a known-good-die test, where a chip is tested for performance before bonding to a circuit board. The first electronic device is a chip which is equipped with electrically conductive bumps to allow for testing. The second electronic device is a circuit board or a substrate. It is very advantageous when the cost of a substrate is appreciably higher than the cost of a chip, for instance, in a multi-layer ceramic (MLC) substrate or in a multi-chip module (MCM). In a known-good-die test, the first electronic device of a chip that can be tested following the procedures described in FIG. 1. After a burn-in and a successful test, the chip can be bonded to a circuit board using procedures described in FIG. 2. The electrical conductive bumps shown in FIG. 1 used in testing are identical to the electrically conductive bumps shown in FIG. 2 used for interconnecting with the circuit board.

In an alternate embodiment of the present invention, an interconnection between two electrical (or electronic) devices can be made by using electrically conductive bumps without any mechanical loading. In this method, a second composite is dispensed on the I/O's of the second electrical device to form bumps. The bumps are dried at a temperature of not higher than 120° C. to form dry resistive bumps. The interconnection between the two devices is made by aligning the corresponding electrical conductive bumps (on the first device) and the dry resistive bumps (on the second device), and then contacting them under a pressure of less than 2,000 psi and at a temperature of less than 260° C. After a time period of less than 10 minutes, the pressure is released and the temperature is reduced to ambient temperature where an interconnection is formed between the two devices.

Figure 2A:
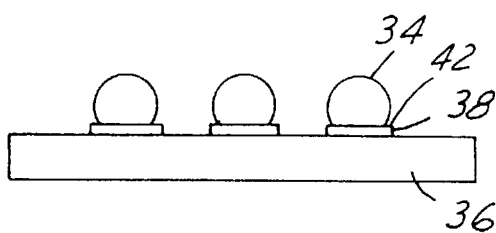
FIGS. 2A–2D shows enlarged, cross-sectional views of an alternate embodiment of the present invention wherein composite bumps on an electronic device are bonded to composite bumps on another electronic device.

An example illustrating the alternate embodiment of the present invention is shown in FIGS. 2A through 2D. A composite bump material 34 is first dispensed on the second electronic device 36 as shown in FIG. 2A to form a wet resistive bump 34. The bump 34 is built on bonding pads 38 that has a conductive surface 42. The second composite bump material has a formulation similar to that of the first composite bump material. As a matter of fact, the two composite bump materials may be from identical dry bump. Even though, it is preferred that the highest glass transition temperature of the polymer binder in the first composite bump material is lower than the highest glass transition temperature of the polymer binder in the second composite bump material. The highest glass transition temperature is defined as the glass transition temperature of the most rigid moiety in a polymer binder which can be made of many components as previously described.

In the next fabrication step, the wet resistive bumps 34 are dried to form dry resistive bumps 35. A suitable drying temperature is less than 150° C. in an environment of vacuum, air, an inert gas, or a reducing atmosphere. The inert gas preferably can be nitrogen, argon, helium, etc. A suitable reducing atmosphere can be forming gas, hydrogen, etc. For the drying cycle, an ambient atmosphere or vacuum is preferred. It should be noted that the dry resistive bump may be resistive or in some cases, slightly conductive. To achieve high metallic conductivity, the bumps can be annealed to form electrically conductive bumps.

Figure 2C:
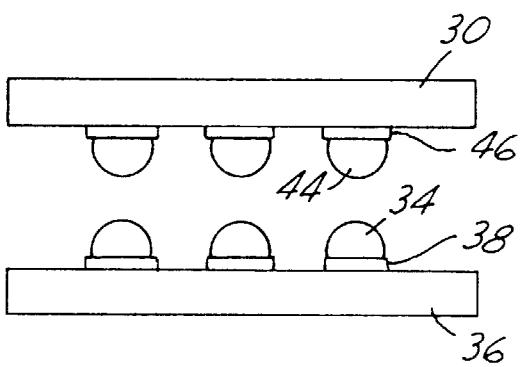

In the next fabrication step, the second electronic device 36 is bonded to the first electronic device 30 that is equipped with electrically conductive bumps 44 built on bonding pads 46. The process of building composite bumps shown in FIG. 2C is similar to the process of building composite bumps shown in FIG. 1B.

The bonding process in the alternate embodiment of the present invention can be achieved by first aligning the electrically conductive bumps 44 on the electronic device 30 and the dry resistive bumps 35 on the electronic device 36. This is shown in FIG. 2C. The corresponding electrically conductive bumps and dry resistive bumps are then contacted under a suitable pressure P and at a suitable temperature T for a sufficient length of time t. It has been found that a suitable bonding temperature T is above the highest glass transition temperature of the polymeric binder. For instance, a typical bonding temperature is in the range of between about 100° C. and about 300° C. A suitable bonding time is in the range of about 0.1 to about 10 minutes, preferably at less than one minute for achieving a reasonable throughput rate. A suitable bonding pressure is between about 10 psi and about 2,000 psi. It has been discovered that for an optimum bonding process, the bonding time t should be as low as possible. This can be achieved by increasing the bonding pressure or the bonding temperature. An increase in the bonding pressure and the bonding temperature will lower the effective viscosity of the material which in turn will improve the quality and quantity of the contact region between the electrically conductive bumps and the dry resistive bumps. An increase in bonding temperature further enhances the interdiffusion of the polymer binder between the electrically conductive bumps and the dry resistive bumps and thus producing a better interconnection in a short bonding time t. It has been noted that during the bonding process, it is preferred that the final bonding pressure be achieved before the final bonding temperature is obtained. This would require that the bonding pressure be ramped up at a faster rate than the bonding temperature.

Figure 2D:
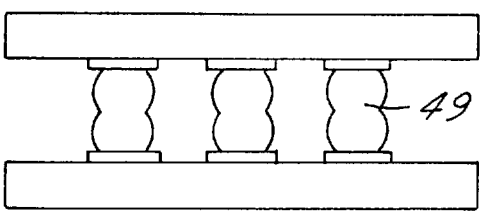

A final structure after the bonding cycle is shown in FIG. 2D. The electrically conductive bumps and the dry resistive bumps are bonded together to form an electrically conductive interconnect 49 joining the two electronic devices 36 and 30. By using the method of the alternate embodiment, the bonding of the two electronic devices 36 and 30 is both mechanically strong and electrically conductive. It has been found that for pad areas 38 and 46 of less than 0.03 mm$^2$, the tensile strength of the bond is higher than 2 MPa and a contact resistance is lower than 10 milli-ohms.

In a second alternate embodiment of the present invention, an interconnection between two electrical or electronic devices can be made by using an electrically resistive solid film without any mechanical loading. In this method, a paste that has the composition described earlier is dispensed on a non-sticking substrate to form a solid film. After the film is solidified and dried, it is removed from the substrate surface to form a free standing film that is highly resistive, i.e., it has a resistivity normally greater than 10,000 $\mu\Omega$-cm. The film can be subsequently used as a solid bonding film which will become conductive after a bonding process is performed. In the bonding process, a piece of the solid bonding film is cut into a desirable shape and placed between two surfaces that need to be bonded. After a pressure of less than 2,000 psi and a temperature of less than 300° C. are applied on the two surfaces for a period of time of less than 10 minutes, the two surfaces on the two devices are bonded together with the bonding film converted to a conductive nature to allow electrical communication between the two devices. One advantage of this second alternate embodiment compared to the first alternate embodiment is that there is no drying process required prior to the bonding cycle between the two surfaces. The gases evolved tend to create air bubbles that decrease the reliability of the interconnect formed.

It should be noted that the materials utilized in the first composite bump and in the second composite bump are completely reworkable. The electrically conductive bumps and the dry resistive bumps and the interconnect made between them can be removed by applying locally a combination of heat and solvent, or in some instances, by solvent alone. In an application where a chip is bonded to a circuit board, the reworkability allows for repair in the field where a non-functional chip can be replaced by a functional chip. For instance, this allows for field service of automobiles on the road. By applying the present invention method, a reworkable applying interconnect structure can be advantageously used in applications such as in the automotive industry, in the consumer electronics industry, in the telecommunications industry and in the micro-electronics industry.

Based on the thermoplastic nature of the polymer binders used in the first composite and in the second composite, the electronic devices shown in FIG. 2 can be debonded. The debonding can be achieved by simply heating the interconnect bump 49 within less than 50° C. below its highest glass transition temperature and mechanically removing the two electronic devices apart with a nonimal pressure of less than 100 psi. The leftover bump material on the two devices can be subsequently removed by using cleaning solvents that would either dissolve or swell the polymer. The cleaning solvents that are suitable for use in the present invention include those of alcohols and ketones.

Another method to achieve debonding is by exposing the interconnect to a cleaning solvent, or a mixture of solvents. It was discovered that when a solvent cleaning process is used, its efficiency can be improved by applying ultrasonic agitation and heat. The field repair/replacement/operations made possible by the present invention can be easily performed since the solvents used are usually non-hazardous and the temperatures used are reasonably low.

The following are four examples illustrating the present invention, where Examples 1 and 2 illustrate the preferred embodiment and Examples 4 and 4 illustrates the alternate embodiment.

EXAMPLE 1

Figure 3:
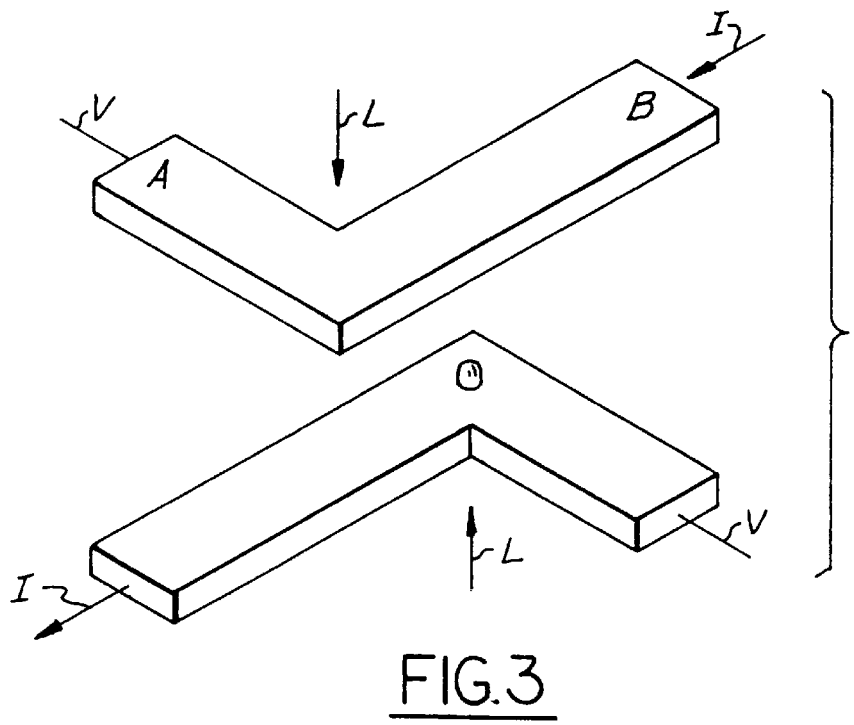
FIG. 3 is a perspective view of a four point probe method for measuring contact resistance.
Figure 4:
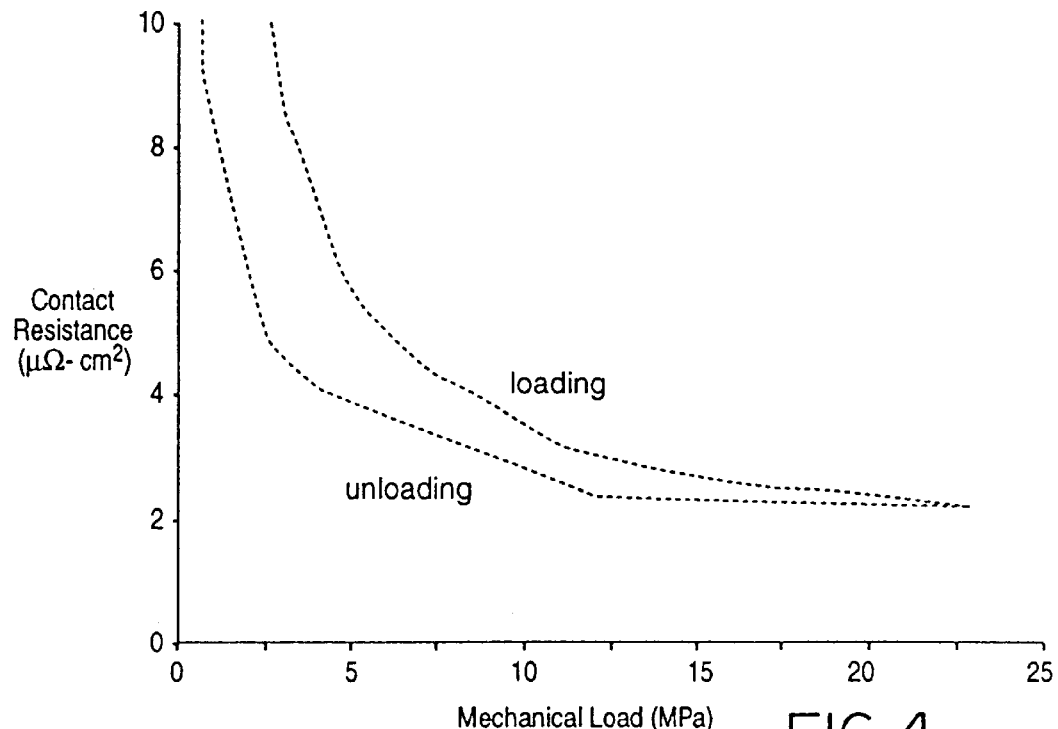
FIG. 4 is a graph showing contact resistance versus contact pressure for an electrically conductive bump in contact with a gold conductive surface.

In this example, a composite bump material is formulated which consists of 30% by weight of polyimide siloxane in a solvent of acetophenone, and 88% by weight (in relation to polymer) silver particles. The average size of the silver flakes is 5 $\mu$m. The composite material is screened through a 250 micron molybdenum stencil to form circular-cross-sectional columns having a radius of about 1.0 mm on a substrate. The substrate used is a 1.65 mm copper sheet with a coating of gold. The copper sheet is cut into an L-shape. The length of the two arms of the L are 25.4 mm, while the width is 6.35 mm. The composite bump is subsequently dried at 70° C. for 5 minutes in air. The dried bump is then annealed at 220° C. for 5 minutes in a forming gas environment (a mixture of nitrogen and hydrogen). The electrically conductive bump is then contacted with an identical L-shaped copper sheet with gold coating. The resultant contact resistance is measured by using a four point method as shown in FIG. 3. The terminals B and D are connected to a current source and the voltage drop between A and C is measured. Since the voltage drop is across the electrically conductive bump screened on the lower L, the total contact resistance R=AV/I is measured, where A=$\pi R^2$=3.14 mm$^2$ is the area of the cross-sectional electrically conductive bump. The contact force is applied using a mechanical tester that is commercially available. The force is measured by using a load cell. FIG. 4 shows a graph illustrating the contact resistance as a function of the applied load where load=applied force/area.

EXAMPLE 2

Figure 5:
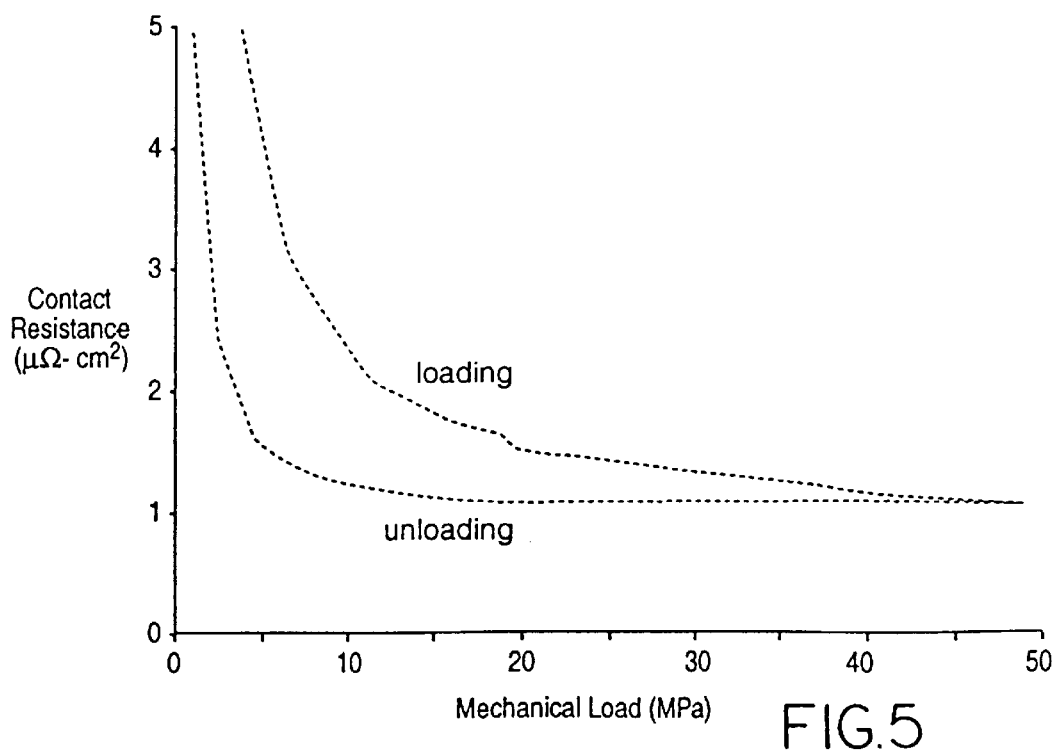
FIG. 5 is a graph showing contact resistance versus contact pressure for an electrically conductive bump in contact with a palladium conductive surface.

In this example, a composite bump material identical to the one used in Example 1 is screened through a 250 micron molybdenum stencil to form circular-cross-sectioned columns having a radius of 1.0 mm on a substrate. The substrate is a 1.65 mm thick copper sheet which has a coating of palladium. The copper sheet is cut to form an L. The length of the two arms are 25.4 mm and the width is 6.35 mm. The composite bump is subsequently dried at 70° C. for 5 minutes in air. The dried bump is then annealed at 220° C. for 5 minutes in a forming gas environment. The electrically conductive bump is then contacted within identical L-shaped copper sheet having a palladium coating. The resultant contact resistance is measured by a four point method such as that shown in FIG. 3. The terminals B and D are connected to a current source and the voltage drop between A and C is measured. Since the voltage drop is across the electrically conductive bump screened on the lower L, the total contact resistance, R=AV/I is measured, where A=$\pi R^2$=3.14 mm$^2$ is the cross-sectional area of the electrically conductive bump. The contact force is applied by using a mechanical tester that is commercially available. The force is measured by using a load cell. FIG. 5 shows a graph illustrating the contact resistance as a function of the applied load=applied force/area.

EXAMPLE 3

Figure 7:
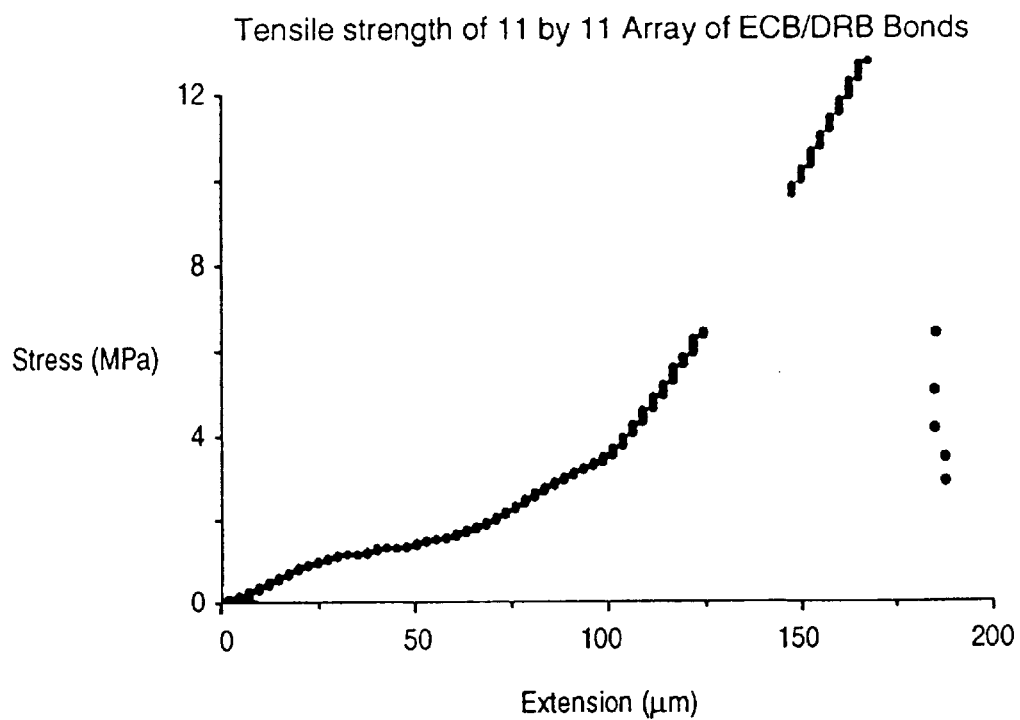
FIG. 7 is a graph illustrating the stress-strain curve under tensile loading for a chip attached to a substrate.
Figure 6A:
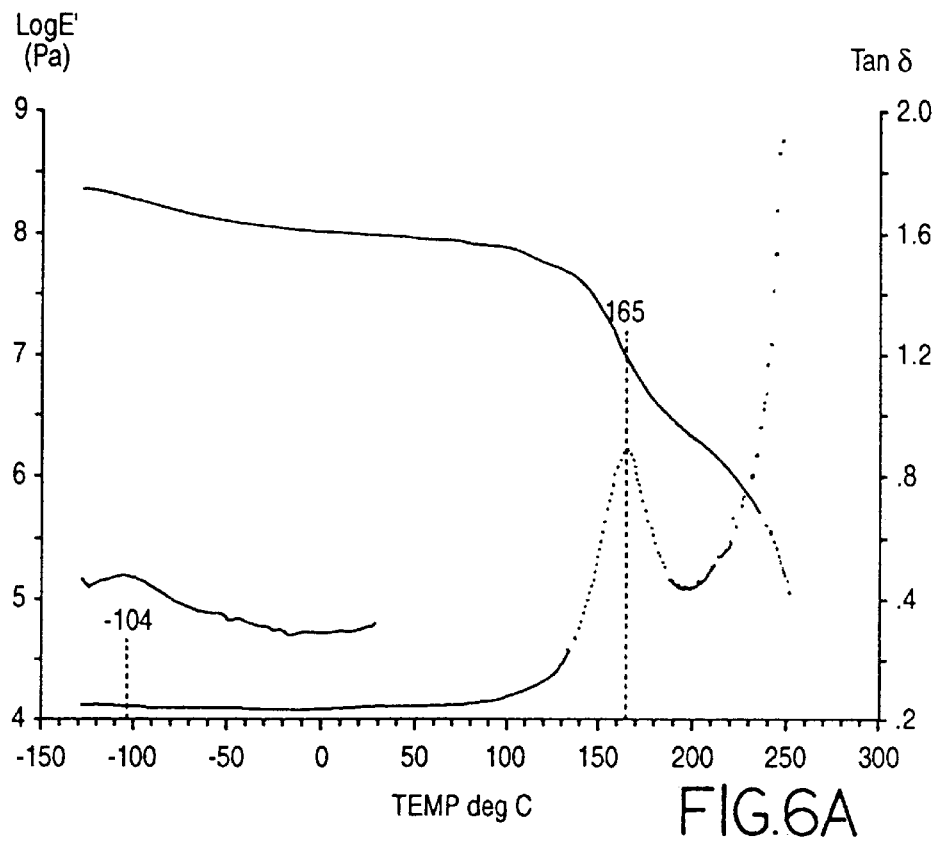
FIGS. 6A and 6B are graphs illustrating the shear modulus, E' and tan as a function of temperature for two different composite bump materials, respectively.
Figure 6B:
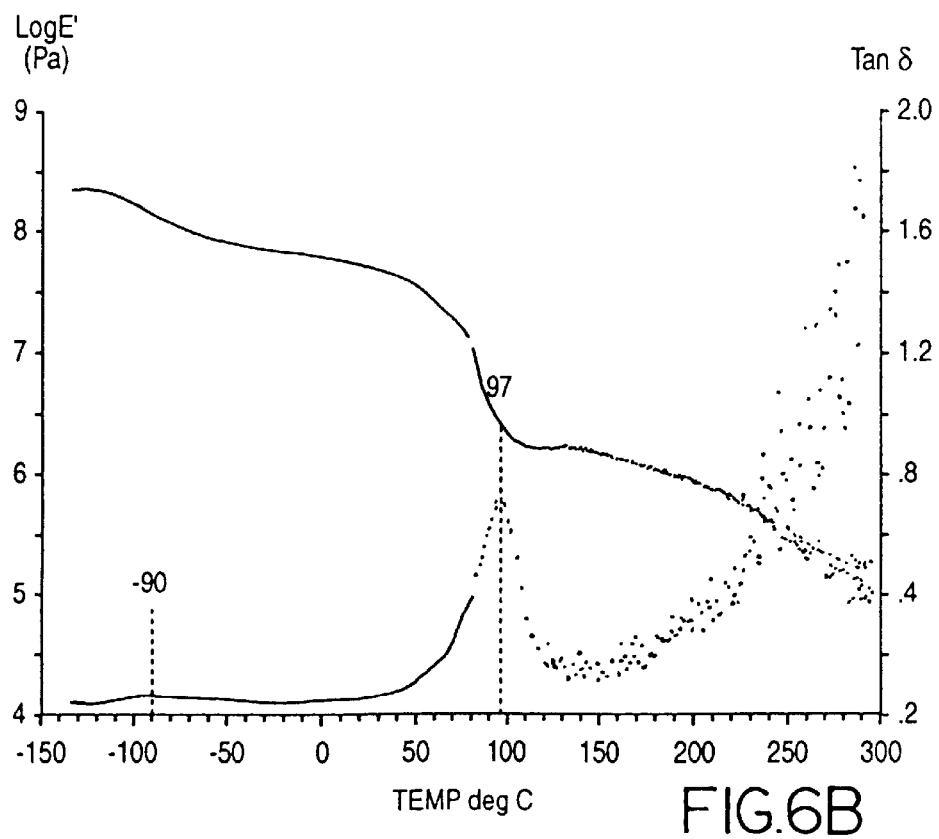

Two composite pastes A and B are used with identical composition of the polymer, solvent and silver as described in Example 1. The polymer binder for both paste A and paste B is polyimide siloxane. However, the silicon content in the polymer for paste A and paste B is 15% and 10%, respectively. As a result, the softening temperature of the polymer binder in paste A is lower than that in paste B. FIGS. 6A and 6B show the shear modulus (E') and tan $\delta$ for the two polymer binders used in paste A and paste B as a function of temperature. The softening temperature is defined as the temperature where the modulus begins to decrease that is close to the maximum tan $\delta$. From FIG. 6, the softening temperatures for paste A and paste B binder polymer are 97° C. and 165° C. respectively. Paste A is dispensed on a 7 by 7 mm silica chip with 500 nm of gold on 20 nm of chromium. The paste is dispensed by screening through a 125 $\mu$m molybdenum stencil with an 11 by 11 array of 150 $\mu$m circular holes at a 200 $\mu$m pitch. The screened pattern is dried at 70° C. for 5 minutes in air. The chip is then annealed at 200° C. for 10 minutes in a forming gas. Paste B is dispensed on a second 9.4 by 9.4 mm silica substrate through a mirror stencil as above. The metallurgy on the substrate is identical to the chip. The paste B on the substrate is subsequently dried at 70° C. in air. The two arrays on the chip and the substrate with paste A in electrically conductive bump and paste B in dry resistive bumps, respectively are aligned and bonded at 1000 psi load at a bonding temperature of 240° C. for a time of 30 seconds. The estimated distance, h, between the chip and the substrate is about 100 $\mu$m. The adhesion strength is measured by pulling the chip from the substrate under tension. FIG. 7 shows the stress-extension behavior of the assembly under tensile load. The strain can be calculated by dividing the extension by h. The bond strength is estimated by the maximum strength at break. For the sample measured in FIG. 7, the bond strength is about 12 MPa. The maximum strain at break is about 150%. Some remnant material are left on the chip and the substrate, respectively. The array indicated the corresponding bumps that were interconnected during the bonding process. The presence of complete coverage of the bumped area on both the chip and the substrate indicates that the failure was cohesive. The typical contact resistance of the interconnect is 0.7–0.8 $\mu\Omega$-cm$^2$.

EXAMPLE 4

In this second alternate embodiment, a solid adhesive film that transform from a resistive state to a conductive state during the bonding process is provided. A paste which has a similar composition to that previously described as paste A in Example 3 is first dispensed on a nonsticking substrate to form a film. The non-sticking substrate is preferably a sheet of Teflon or a sheet of other materials coated with Teflon. The thickness of the film dispensed is between about 1 and between about 500 $\mu$m range. The dispensing method can be selected from stenciling, screen printing, extrusion, or any other standard dispensing techniques suitable for dispensing a film of high viscosity fluid on a substrate. The dispensed film is then dried at between 20° C. to 150° C. to form a solid film including the components of thermoplastic polymeric binder, metal particles and a trace amount of solvent. The amount of solvent is normally less than 2% by wt. The film is then peeled and removed from the substrate to form a free standing film that is highly resistive, i.e., having an electrically resistivity larger than 10,000 $\mu\Omega$-cm. The film can then be processed as a solid bonding film.

In bonding two electronic devices together, a solid bonding film is first cut to a desirable shape by mechanical means such as blades, scissors, or cutters. The film is then placed on one of the two surfaces on the two electronic devices that need to be bonded together. The surface on the second electronic device is then brought in contact with the surface of the bonding film. After a pressure of less than about 2,000 psi and a temperature in the range of between about 150° C. and about 300° C. are applied for a time period of less than 10 minutes, the surfaces on the two electronic devices are bonded together while the resistive bonding film is converted to an electrically conductive film with a resistivity of less than 1000 $\mu\Omega$-cm. The two electronic devices are securely bonded together.

In yet another alternate embodiment, the solid bonding film can also be used as a conducting media to connect two regions of a substrate. After a film is placed over the two regions on the substrate, the substrate is heated to a temperature between about 150° C. and about 300° C. to convert the resistive film into an electrically conductive film. During the heating cycle, the film will also bond to the substrate. The substrate used in this application may be glass, ceramic, an organic substrate such as polyimide, or silicon. One of the advantages of the alternate embodiment is that no degassing may occur during the bonding cycle, when the solid bonding film is used to interconnect the two surfaces on the two electronic devices.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the invention.

The embodiments of the invention in which an exclusive property or privilege is claimed are defined as follows:

1. An electrical device comprising:
   a plurality of pads positioned on said electrical device for making electrical interconnections thereto, each said pad having an electrically conductive surface, and
   a substantially electrically conductive first composite adhered to said pads, said electrically conductive first composite comprises thermoplastic polymeric binder and at least about 30% by volume of conductive metal particles based on the total volume of said metal particles and said thermoplastic polymer, said electrically conductive first composite deforms elastically to at least 15% deformation.

2. The electrical device of claim 1 further comprising:
   a plurality of separate electrical contacts positioned over corresponding ones of said pads, and
   mechanical means for applying a sufficiently high pressure between said first composite and said electrical contacts wherein said first composite deforms elastically such that electrical interconnections are made.

3. The electrical device of claim 2, wherein said plurality of separate electrical contacts are bonding pads.

4. The electrical device of claim 2, wherein said separate electrical bonding pads have electrically conductive surface.

5. The electrical device of claim 2, wherein said electrical contacts are positioned on a substrate in a fixed relationship to one another.

6. The electrical device of claim 5, wherein said substrate is selected from the group consisting of a connector, a printed circuit board, a multi-layer structure, a second electrical device and a semiconductor device.

7. The electrical device of claim 1 further comprising a second composite positioned over corresponding ones of said first composite forming an electrical and mechanical joint.

8. The electrical device of claim 7 further comprising electrical contacts adhered to respective ones of said second composite.

9. The electrical device of claim 8, wherein said electrical contacts are positioned on a substrate in a fixed relationship to one another.

10. The electrical device of claim 9, wherein said substrate is selected from the group consisting of a connector, a printed circuit board, a multi-layer structure, a second electrical device, and a semiconductor device.

11. The electrical device of claim 1, wherein said electrically conductive first composite is removably adhered to said pads.

12. The electrical device of claim 2, wherein said first composite and said electrical contacts are releasably connected together by said mechanical means.

13. An electronic assembly formed by two electronic devices bonded together to establish electrical communication thereinbetween comprise a layer of a solid film positioned between said electrically conductive surfaces on said two devices, said film comprises a thermoplastic polymer binder and at least about 30% by weight of conductive metal particles based on the total volume of the metal particles and the thermoplastic polymer binder. said film deforms elastically to at least 15% deformation.

14. An electronic assembly according to claim 13, wherein said solid film bond said devices together under a pressure and temperature sufficient to establish electrical communication between said two devices.

15. An electronic assembly according to claim 14, wherein said pressure and temperature is less than 2,000 psi and between about 150° C. and about 300° C., respectively.

16. An electronic assembly formed by two electronic devices bonded together to establish electrical communication thereinbetween comprises a layer of a solid film positioned between said electrically conductive surfaces on said two devices, said film comprises a, thermoplastic polymer binder and at least about 30% by weight of conductive metal particles based on the total volume of the metal particles and the thermoplastic polymer binder such that the film converts from a resistivity of larger than 1,000 $\mu\Omega$-cm to a resistivity of less than 1,000 $\mu\Omega$-cm during a bonding process.

17. An electronic assembly according to claim 16, wherein said solid film bond said devices together under a pressure and temperature sufficient to establish electrical communication between said two devices.

18. An electronic assembly according to claim 16, wherein said pressure and temperature is less than 2,000 psi and between about 150° C. and about 300° C., respectively.

19. An electrical device comprising:

a plurality of pads positioned on said electrical device for making electrical interconnections thereto, each said pad having an electrically conductive surface, a substantially electrically conductive first composite adhered to said pads, said electrically conductive first composite comprises thermoplastic polymeric binder and at least about 30% by volume of conductive metal particles based on the total volume of said metal particles and said thermoplastic polymer, a plurality of separate electrical contacts positioned over corresponding ones of said pads, and mechanical means for applying a sufficiently high pressure between said first composite and said electrical contacts wherein said first composite deforms elastically to at least 15% deformation such that electrical interconnections are made.

20. An electrical device comprising:

a plurality of pads positioned on said electrical device for making electrical interconnections thereto, each said pad having an electrically conductive surface, and a substantially electrically conductive first composite adhered to said pads, said electrically conductive first composite comprises thermoplastic polymeric binder and at least about 30% by volume of conductive metal particles based on the total volume of said metal particles and said thermoplastic polymer, said electrically conductive first composite having a glass transition temperature in the range from about 100° C. to about 240° C.

21. An electrical device comprising:

a plurality of pads positioned on said electrical device for making electrical interconnections thereto, each said pad having an electrically conductive surface, and a substantially electrically conductive first composite adhered to said pads, said electrically conductive first composite comprises thermoplastic polymeric binder and at least about 30% by volume of conductive metal particles based on the total volume of said metal particles and said thermoplastic polymer, and a second composite positioned over corresponding ones of said first composite forming an electrical and mechanical joint, said second composite having a glass transition temperature in the range from about 150° C. to about 250° C.

* * * * *